United States Patent [19]

Morrison et al.

[11] 4,193,044
[45] Mar. 11, 1980

[54] RARE EARTH SEMICONDUCTOR LASER

[75] Inventors: Clyde A. Morrison, Wheaton; Nick Karayianis; Donald E. Wortman, both of Rockville, all of Md.

[73] Assignee: The United States of America as represented by the Secretary of the Army, Washington, D.C.

[21] Appl. No.: 872,516

[22] Filed: Jan. 26, 1978

[51] Int. Cl.² ............................................. H01S 3/18
[52] U.S. Cl. ............................. 331/94.5 F; 331/94.5 H
[58] Field of Search ...................... 331/94.5 F, 94.5 H; 330/4.3

[56] References Cited

U.S. PATENT DOCUMENTS

| | | | |
|---|---|---|---|
| 3,354,406 | 11/1967 | Kiss | 331/94.5 H |
| 3,833,862 | 9/1974 | Wickersheim et al. | 331/94.5 F |

*Primary Examiner*—William L. Sikes
*Attorney, Agent, or Firm*—Nathan Edelberg; Robert P. Gibson; Saul Elbaum

[57] ABSTRACT

A rare earth semiconductor laser is disclosed comprising a semiconductor material of the type $Ln_2TX_5$ where Ln is a rare earth element, T is zirconium or hafnium, and X is sulfur or selenium. The semiconductor contains neodymium as a dopant rare earth ion and can be made to lase by applying an electric voltage.

9 Claims, 1 Drawing Figure

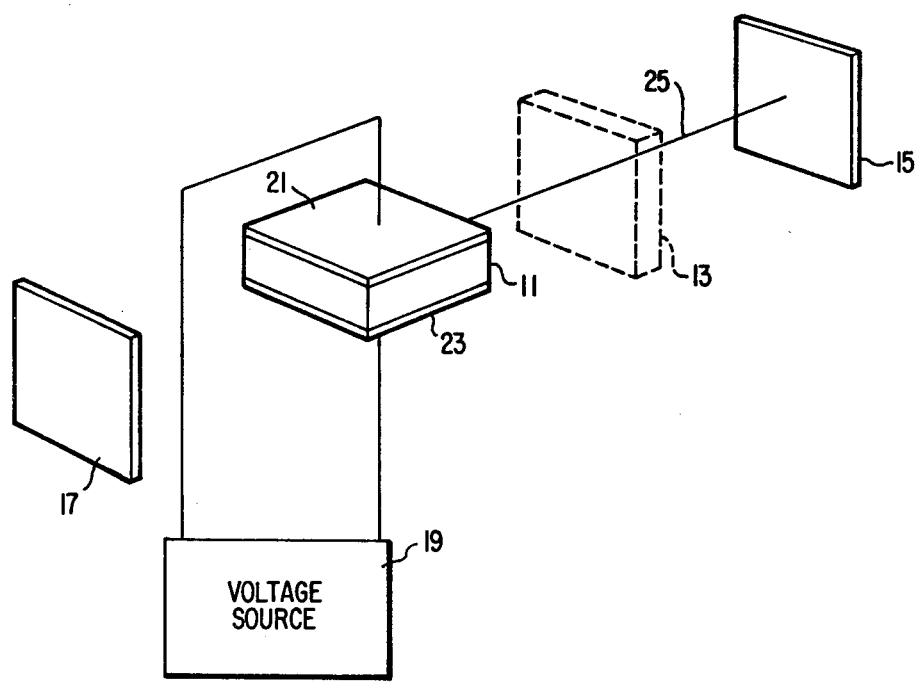

RARE EARTH SEMICONDUCTOR LASER

RIGHTS OF THE GOVERNMENT

The invention described herein may be manufactured, used and licensed by or for the United States Government for governmental purposes without the payment to us of any royalty thereon.

BACKGROUND OF THE INVENTION

The present invention relates generally to laser devices and more particularly to an improved solid state laser device utilizing electric field pumping means.

Solid state devices for effecting laser action are known including a host crystal doped with substitutional impurities to provide the laser ions. The stimulated emission of radiation is brought about by pumping optical energy into the crystal, as for example with a spiral flash lamp surrounding the crystal and connected to a suitable energy source. In other embodiments, the pumping lamp is positioned near the laser crystal and imaged on the crystal by optical means. The optical energy provides an inverted population between two energy levels of the laser ions. Regenerative means in the form of end coatings of high reflectance or end mirrors or semitransparent surfaces adjacent the ends of the crystal serve to stimulate coherent emission of monochromatic light of a wavelength and frequency corresponding to the energy difference between the two energy levels and the emitted light is coupled out of the system through an opening in the regenerative means.

The requirement of discrete optical energy pumping means in the prior art laser system precludes the latter's use in applications requiring miniaturization. Thus, the prior art devices are impractical for use in miniature rangefinders and illuminators or in integrated optics systems.

SUMMARY OF THE INVENTION

Accordingly, it is an object of the present invention to provide an improved solid state laser device.

It is another object to provide such a device including a semiconducting host crystal doped with rare earth ions to provide the lasting action.

It is a further object to provide such a device which can be pumped with an electric field.

It is yet another object to provide such a device which is practical for applications requiring miniaturization.

The objects of the invention are achieved by a solid state laser device including a host material constituting a single crystal of the general type $Ln_2TX_5$ where Ln is a rare earth, T is zirconium or hafnium, and X is sulfur or selenium. This material has a crystal composition readily permitting the substitution of optically active rare earth $Nd^{3+}$ ions, for example, at the $Ln^{3+}$ sites and a band gap sufficiently wide and of the order of 2 e.V. so that the laser radiation is not absorbed once the rare earth ion is substituted. The pumping of energy into the crystal to effect stimulated emission is provided by the application of a high electric field across a region of the crystal, as for example by electrodes connected to an external source of voltage. Conduction electrons drifting in the high field region attain kinetic energies sufficient for impact excitation of the $Nd^+$ ions, giving rise to an inverted population between two energy levels of the $Nd^{3+}$ ions. Regeneration means are provided to stimulate the coherent emission of monochromatic light of a wavelength and frequency corresponding to the energy difference between the energy levels.

The laser device has the advantageous feature of being pumped with conventional a.c. or d.c. circuitry. Further, it possesses the feature of adaptability to miniaturized circuits and integrated optics systems. It can be modulated and can be built to operate from the submillimeter to the red wavelength regions.

BRIEF DESCRIPTION OF THE DRAWINGS

A more complete appreciation of the invention and many of the attendant advantages thereof will be readily obtained as the same becomes better understood by reference to the following detailed description when considered in conjunction with the accompanying drawings wherein:

The FIGURE is a schematic perspective view of the basic components making up the laser device of the invention.

DESCRIPTION OF THE PREFERRED EMBODIMENT

Referring to the FIGURE there is shown a rare earth-semiconductor laser system that includes a laser crystal 11 and an optional Q-switching means 13 shown by dotted lines disposed between regeneration means to form a resonant laser cavity. While a variety of regeneration means for stimulating coherent emission of light from the crystal can be provided, such means may take the form illustrated in the FIGURE of reflectors 15 and 17. Reflector 15 is partially reflecting to permit the escape of coherent radiation 25 whereas reflector 17 is highly reflective. Pumping energy is supplied to the crystal by electrical pumping means. While the electrical pumping means may take a variety of forms, it may take the form illustrated in the FIGURE of a voltage source 19 and electrodes 21 and 23 which are disposed on the lateral surfaces of the laser crystal 11 and which are connected to the negative and positive terminals of source 19.

The material of which the crystal 11 consists includes a host semiconductor which will accept large concentrations of lasing ions and which has a band gap wide enough to be transparent to light emitted by the lasting ions, yet narrow enough to allow conduction of electrons in the crystal at normal voltages. The single crystal laser material can be, for example, $Ln_{2-z}Nd_zTX_5$ ($0 < z \leq 2$)

where
- Nd = neodymium
- Ln = a rare earth element or yttrium
- T = zirconium or hafnium
- X = sulfur or selenium.

In operation of the device, conduction electrons in the host semiconductor are caused to drift in the electric field caused by a voltage which is applied to the crystal by the electrical pumping means. The conduction electrons obtain sufficiently high kinetic energies to excite the optically active neodymium ions by direct impact excitation; that is, by putting an electron from a neodymium ion in an excited state of the ion, leading to the production of an excess population in the $^4F_{3/2}$ state of the neodymium ion. The laser transition occurs between this state and the $^4I_{11/2}$ state of neodymium at a wavelength near 1.06 microns. Since this state is approximately 200 $cm^{-1}$ above the ground state, the population inversion necessary for laser action is relatively easy to produce at room temperature. After the laser transition occurs, the neodymium ion relaxes non-radiatively to the ground state.

The $Ln_2TX_5$ compositions of the invention are conveniently made in single crystalline form by techniques in "The Preparation of $Ln_2MX_5$ where Ln=RARE EARTHS, M=Zr and Hf, and X=S, Se" by P. Donahue and W. Jeitschko, Mat. Res. Bull., Vol. 9, pp. 1333-6 (1974); and "$Y_2HfS_5$ with Ordered $U_3Se_5$ Type Structure and Related Compounds" by W. Jeitschko and P. C. Donahue, Acta Crystallographica, Vol. B31, pp. 1890-4 (1975), herewith incorporated by reference. The $Ln_2TX_5$ powders may themselves be of the final desired $Ln_2TX_5 Nd^{+3}$ composition, or alternatively, the neodymium can be added to the host $Ln_2TX_5$ separately in an amount designed to yield, upon melting and recrystallization, the desired final composition.

The laser can be fabricated in a wide range of geometries, cylindrical rods, slabs, and the resonant laser cavity can assume a variety of configurations, including those where the laser crystal has reflecting ends, becoming itself the resonant cavity. Under these circumstances the ends may be flat or may assume curved shapes as well depending on the type of cavity desired.

The laser can be used either as a source of laser radiation or, in conjunction with a second laser as an amplifier of laser radiation. It can be operated in a variety of ways to yield either cw, mode locked, pulsed or Q-switched performance.

We wish it to be understood that we do not desire to be limited to the exact details of construction shown and described, for obvious modifications can be made by a person skilled in the art.

What is claimed as new and desired to be secured by Letters Patent of the United States is:

1. A solid state laser device comprising:
    a semiconductor material constituting a single crystal containing optically active ions with given energy levels; said semiconductor material having the formula $Ln_2TX_5$, where Ln is a rare earth element, T is zirconium or hafnium, and X is sulfur or selenium;
    regeneration means exhibiting high reflectance at given wavelengths optically coupled to opposite end portions of the crystal for stimulating coherent emission of light from the crystal; and
    electrical pumping means coupled to the crystal for effecting an inverted population state of the optically active ions between certain ones of the given energy levels by impact excitation,
    whereby stimulated emission is emitted from the crystal at a frequency corresponding to the energy difference between the certain ones of the given energy levels and at wavelengths corresponding to the given wavelengths.

2. The solid state laser device cited in claim 1 wherein the electrical energy pumping means includes:
    means for connecting the crystal across an external voltage source.

3. The solid state laser device recited in claim 2 wherein the voltage source connecting means includes:
    a pair of electrodes disposed on lateral surfaces of the crystal.

4. The solid state laser device recited in claim 3 including:
    Q-switching means disposed between the regeneration means and the crystal.

5. The solid state laser device recited in claim 3 wherein the optically active ion is a rare earth ion.

6. The solid state laser device recited in claim 5 wherein the electrical pumping means includes:
    means for connecting the crystal across an external voltage source.

7. The solid state laser device recited in claim 3 wherein the optically active ion is neodymium.

8. The solid state laser device recited in claim 7 wherein the voltage source connecting means includes:
    a pair of electrodes disposed on lateral surfaces of the crystal.

9. A single crystal laser material whose chemical structure is expressed by the generals formula
    $Ln_{2-z}Nd_zTX_5$ $(0 < z \leq 2)$
    where:
    Ln=a rare earth element
    Nd=neodymium
    T=zirconium or hafnium
    X=sulfur or selenium.

* * * * *